United States Patent
Maas et al.

(10) Patent No.: US 10,014,165 B2
(45) Date of Patent: Jul. 3, 2018

(54) RADIATION SENSOR DEVICE FOR HIGH ENERGY PHOTONS

(71) Applicant: Nederlandse Organisatie voor toegepast-natuurwetenschappelijk onderzoek TNO, 's-Gravenhage (NL)

(72) Inventors: Diederik Jan Maas, 's-Gravenhage (NL); Evert Nieuwkoop, 's-Gravenhage (NL); Erwin John van Zwet, 's-Gravenhage (NL); Michel van Putten, 's-Gravenhage (NL); Norbertus Benedictus Koster, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 43 days.

(21) Appl. No.: 15/312,406

(22) PCT Filed: May 20, 2015

(86) PCT No.: PCT/NL2015/050365
§ 371 (c)(1),
(2) Date: Nov. 18, 2016

(87) PCT Pub. No.: WO2015/178773
PCT Pub. Date: Nov. 26, 2015

(65) Prior Publication Data
US 2017/0092474 A1    Mar. 30, 2017

(30) Foreign Application Priority Data

May 20, 2014 (EP) .................................. 14169153

(51) Int. Cl.
G01J 1/42 (2006.01)
H01J 40/16 (2006.01)
G03F 7/20 (2006.01)

(52) U.S. Cl.
CPC .......... *H01J 40/16* (2013.01); *G03F 7/70483* (2013.01)

(58) Field of Classification Search
CPC ............................ G03F 7/70483; H01J 40/16
See application file for complete search history.

(56) References Cited

U.S. PATENT DOCUMENTS 2,442,824 A  6/1948  Polye
3,732,452 A * 5/1973  Axmark .................. H01J 47/08
                                                             250/373

(Continued)

*Primary Examiner* — Kiho Kim
(74) *Attorney, Agent, or Firm* — Hoffman & Baron, LLP

(57) ABSTRACT

A radiation sensor device is disclosed for use with a radiation source, capable of emitting radiation with photon energies larger than the work function of the target comprising a target plate to be impacted by the radiation to generate photo-electrons, the target plate being electrically isolated from a shielding electrode. The shielding electrode is arranged to collect energy-filtered photo-electrons from the target plate, using an electrostatic barrier for the filtering. The target plate is constructed of a carbon material. A current measurement device is operative to keep the target plate at a preset voltage difference with respect to the shielding electrode and measure a photo-electron deficit current as a result of radiation impact on the target plate.

16 Claims, 6 Drawing Sheets

(56) References Cited

U.S. PATENT DOCUMENTS

| | | | |
|---|---|---|---|
| 3,798,451 A | | 3/1974 | Eberhardt |
| 4,616,248 A | * | 10/1986 | Khan .................. H01J 1/34 |
| | | | 257/11 |
| 2011/0079737 A1 | | 4/2011 | Scholz et al. |
| 2011/0220806 A1 | | 9/2011 | Rooijakkers et al. |

* cited by examiner

RADIATION SENSOR DEVICE FOR HIGH ENERGY PHOTONS

This application is the U.S. National Phase of, and Applicants claim priority from, International Patent Application Number PCT/NL2015/050365 filed 20 May 2015, which claims priority from EP 14169153.5 filed 20 May 2014, each of which is incorporated herein by reference.

FIELD

The present invention relates to a radiation sensor device for use with a radiation source emitting radiation with a high photon energies. Specifically, the invention relates to a radiation sensor device for use in an extreme ultraviolet systems.

BACKGROUND

In environments with challenging electromagnetic radiation sources of substantial photon energies, in particular, CT-scanners, plasma generators or EUV lithography systems, a desire exists to be able to monitor the amount of high energy photons generated by that source. In an EUV scanner the amount of contamination growth on a sensor or optical element is rather unpredictable, and implies an unpredictable decay of sensor sensitivity or mirror reflectivity, both of which in turn cause a negative effect on dose control accuracy and precision. Another desire may be to monitor and/or limit the contamination of the optical elements and the dose sensor system, and in particular, the optical systems arranged to condition the beams of radiation coming from the radiation source. Furthermore, it may be desirable to be able to monitor the amount of contamination that is accumulating in the optical path and to monitor the transmission/absorption/reflection of an optical element or set of optical elements. US2011079737A1 mentions measuring photocurrent from a EUV ML facet. The disclosed sensor devices are however sensitive to contamination on the top coating. U.S. Pat. No. 3,798,451 shows a light sensitive diode that measures a photon current. The device is unsuitable for high energy radiation because of its face plate that will not transmit the wavelengths of interest. In addition the device is sensitive to contamination. For these problems the inventions seeks to find a solution.

SUMMARY

In an aspect of the invention there is provided the features listed in claim 1. In particular, a radiation sensor device is disclosed for use with a radiation system, capable of transmitting radiation with high energy photons comprising a target comprising a surface impact region to be impacted by the radiation to generate photo-electrons, the target being electrically conductive and isolated from a shielding electrode. The shielding electrode is arranged to collect photo-electrons from the target. The surface impact region is formed of an electrically conductive material of a dominant contamination material provided with a thickness larger than 50 nm. A current measurement device that is operative to keep the target plate at a preset voltage difference with respect to the shielding electrode and measure a photo-electron deficit current as a result of radiation impact on the surface impact region.

Specifically, in an embodiment, there is provided a sensor device comprising a target of the same material as the major known contaminant (e.g. carbon), so that the sensor has improved tolerance to contamination. Photons from the source and other photons that have a significantly lower energy per photon hit this target and during their absorption create an electron signal by the photo-electric effect. The resulting electron emission is detected by measuring the deficit current from the target to a shielding electrode. The shielding electrode optionally forms an electrostatic potential barrier that reflects photo-electrons with a lower kinetic energy (e.g. either created by lower energy photons, or EUV photo-electrons that have undergone inelastic scattering in the quasi field-free region) but absorbs high-energy photo-electrons, thereby inhibiting electrons generated by lower-energy photons to contribute to a measured photo-electron current. In an embodiment this sensor device can discriminate between out-of-band power (non-EUV signal) and EUV power.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
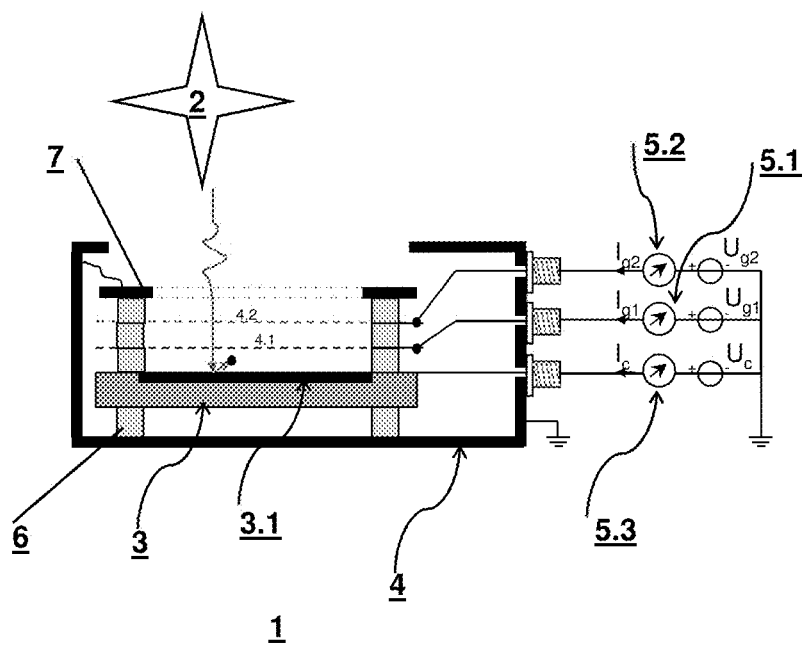
FIG. 1 depicts a sensor device according to an embodiment of the invention.

Unless otherwise defined, all terms (including technical and scientific terms) used herein have the same meaning as commonly understood by one of ordinary skill in the art to which this disclosure belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some instances, detailed descriptions of well-known devices and methods may be omitted so as not to obscure the description of the present systems and methods.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

The term "high energy photons" is used to denote electromagnetic radiation of sources emitting radiation with photon energies larger than a work function of the target material, so that photo-electrons can be generated. For a typical application for radiation systems, such high energy photons may have a photon energy larger than 5 eV not excluding that radiation is also emitted with energies lower than 5 eV.

With terms "radiation" and "beam" as used herein encompass all types of high energy electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), in particular, a spectral component with energy larger than 5 eV is present. In another aspect, the application mentions 'out-of-band' radiation which is defined as radiation with a photon energy less than 64 eV.

The "current measurement device" may comprise one or more processors configured to perform operational acts in accordance with the present systems and methods, such as to provide control signals to the various other components. The processor may be a dedicated processor for performing in accordance with the present system or may be a general-purpose processor wherein only one of many functions operates for performing in accordance with the present system. The processor may operate utilizing a program portion, multiple program segments, or may be a hardware device utilizing a dedicated or multi-purpose integrated circuit. Any type of processor may be used such as dedicated or shared one. The processor may include micro-controllers, central processing units (CPUs), digital signal processor s (DSPs), ASICs, or any other processor(s) or controller(s) such as digital optical devices, or analog electrical circuits that perform the same functions, and employ electronic techniques and architecture. The controller or processor may further comprise a memory that may be part of or operationally coupled to the controller. The memory may be any suitable type of memory where data is stored. Any medium known or developed that can store and/or transmit information suitable for use with the present systems and methods may be used as a memory. The memory may also store user preferences and/or application data accessible by the controller for configuring it to perform operational acts in accordance with the present systems and methods.

In the disclosure, unless otherwise disclosed with 'dominant contamination material' it is meant that the subject material of a target is formed of a dominant contamination material in the radiation system. A 'surface impact region' of the target signifies at least parts of the target material exposed to the radiation. The surface impact region is homogenous and extends from an exposed surface in order to generate a measurable photo-electric effect, which requires a certain extension in layer thickness that can be calculated depending on application but is at least larger than 50 nm. Dominant contamination can be measured in the radiation system by collecting and measuring the contamination. In many parts of a radiation system the dominant contamination material is carbon. 'Monolithically formed' means that that dominant contamination material is formed without deficits, in a substantially homogenous and isotropic way however, irrespective of it's allotropy.

In FIG. 1 a first embodiment of the invention is shown, showing an optical sensor device system 1 exposed to an EUV source 2 wherein a dominant contamination material is tin (Sn). Typically, the source 2 comprises a plasma source 2 such as a Sn or Xe source, a free electron laser, a synchrotron, being devices per se known to the skilled person, or any source capable of generating radiation with photon energies larger than 5 eV. The source 2 depicted in FIG. 1 is typically operated in a pulsed way so that periodically EUV radiation may be generated in conjunction with debris (not disclosed) traveling from the source that may be partly captured with known means. In the depicted embodiment the optical sensor device system 1 comprises a tin target 3 that absorbs the radiation from an EUV source. The target 3 comprises an surface impact region 3.1 that is electrically isolated from a shielding electrode mesh or grid or a complex conductive structure. Photons that have sufficient energy generate a photo-emission current in the surface impact region 3.1. The surface impact region 3.1 may be integral to target 3, or may be a distinct upper layer connected to a conductive target plate 3, for example, by electrically conductive connection. Alternatively, an electrode wire is in direct electrical contact with the surface impact region 3.1 and the target plate is isolating. The generated photoelectron current can be measured using current meters 5.1, 5.2, 5.3 that may float on a bias voltage. Other measurement circuit arrangements are possible than the ones depicted; the voltage and current measurement devices 5.1-5.3 are connected to the device 1 in exemplary fashion. In addition, grid 4.2 may be used for trapping spurious charges from other parts of the vacuum system. The bias voltage can be chosen to a fixed value, to prevent photo-electrons generated by photons having a lower energy than EUV radiation to reach the shielding electrode 4.1.

Shielding electrode 4.2 may also be biased to eliminate any additional photo-electrons generated in the grid 4.2 by the EUV. In addition, the grid may be used to distinguish between higher and lower energy electrons reaching any of the shielding electrode 4.1 or 4.2 to measure a spectral characteristic of the radiation. An electrically insulating spacer 6 is provided distancing the target plate 3 from the housing 4, shielding electrodes 4.1 and 4.2 and clamps 7 fixing, e.g. by clamping, gluing or welding or by other suitable fixing the target plate 3 to the spacer 6. Clamps may be grounded to housing 4 to avoid charge build up.

Figure 2A:
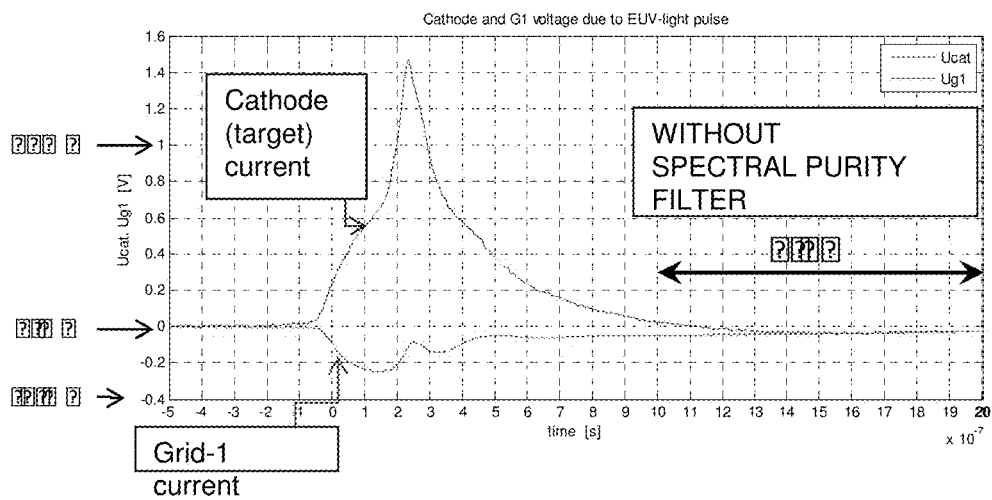
FIG. 2A en 2B depict measurement results
Figure 2B:
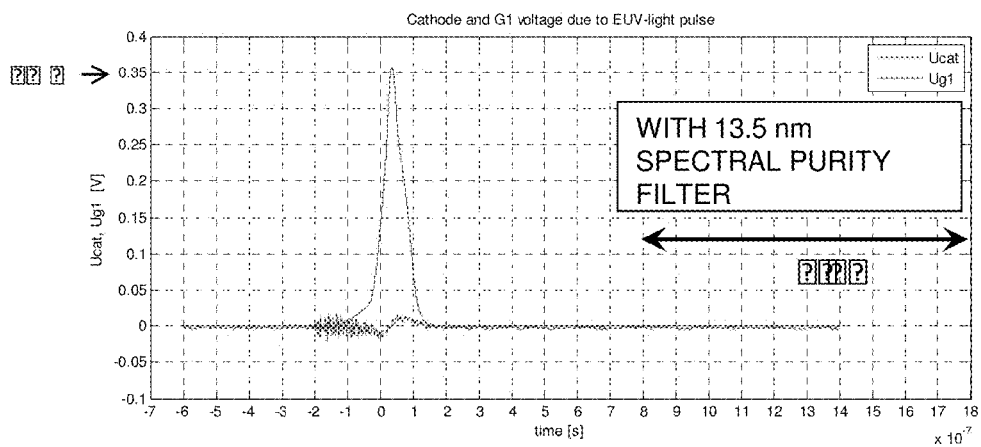

FIGS. 2A and 2B show traces of recorded time-dependent currents in the measurement devices 5.1. and 5.3 of FIG. 1 for a target material that is formed of carbon. In the traces the source pulse characteristics of an EUV pulse can be observed, in FIG. 2A without a spectral purity filter placed before the detector 1, and in FIG. 2B with a spectral purity filter. A short EUV pulse (e.g. about $1\text{-}2 \times 10^{-7}$ sec) may be superimposed on a longer UV-VUV (i.e. out-of band) pulse (e.g. $5\text{-}20 \times 10^{-7}$ sec), as emitted by a Xenon plasma based EUV source. It is clearly shown that the EUV peak can be measured with a measurement current ranging between 5 and 25 mA, with or without spectral filtering. The measured peaks can be integrated and calibrated in known fashion—advantageously after subtraction of the out-of-band photo-electron current part, to measure received EUV power.

Figure 3:
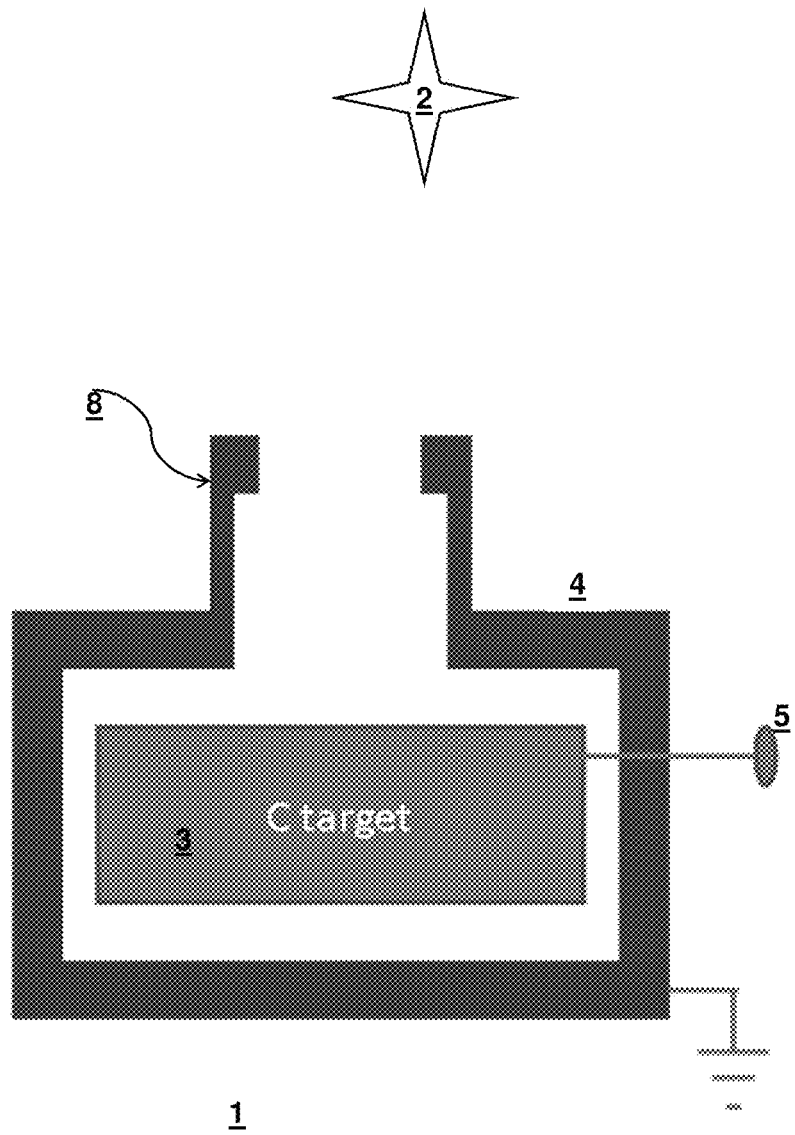
FIGS. 3 and 4 depict further embodiments of the invention.

In FIG. 3, another embodiment is shown of a radiation sensor device, engineered in a simpler form than the embodiment of FIG. 1 that is surprisingly effective, in the environment of an EUV lithographic system, where carbon is a dominant contaminant material. In order to collect photo-electrons relevant for the EUV spectral band, shielding electrode 4 is provided as a housing for the target plate 3. In this embodiment the housing, functioning as shielding electrode, comprises an aperture entry 8 extending from the target plate by a length larger than three times the aperture diameter. By the extension, electrons with a mean free path of several centimeters can substantially be trapped by the housing while preventing spurious electrons hitting the target plate. Dimensions may vary for desired applications, for example, in a typical embodiment, the aperture may have a diameter of 0.5-1.5 cm, and the extension may have a length of 1.5-4 cm, so that a suitable range could extend between values from three times to for example 10 times the aperture diameter. In the application the current measurement device may operate with a bias voltage between target 3 and housing 4 that can be scanned, while the measured photocurrent can be used to monitor the source power output in spectral bands ranging from UV (400 nm) to beyond EUV (10 nm). Also, for example, by a scanning bias voltage an identified current profile may be used for identification of impurities different than a dominant contamination and contamination level on the surface of the sensor In the disclosed embodiment, the target plate has a surface impact region that is provided from monolithically formed electrically conductive carbon material, advantageously of a purity larger than 90 weight percent, over a thickness of more than 1 micrometer over the entire surface impact region. By way of example, the target plate 4 is provided from electrically conductive carbon material that is a graphite, graphene, amorphous carbon. By a suitable conductivity the photo electron current can be measured, for example a resistivity lower than 1 Ohm·m. The current measurement device 5 may be arranged to measure the photo-electron deficit current as a function of a preset bias voltage so that a specified current profile, similar to the traces of FIG. 2A, 2B, may be used for identification of impurity impact and impurity level of the contamination on the sensor or optics surface. This may be carried out by setting the bias voltage of the target e.g. by means of a knob, that can be tuned to suppress Out-of-Band signal and read out a purely EUV signal in a power monitoring mode, and also as a source spectral output characterization sensor device by sweeping the target bias voltage over an appropriate range (i.e. covering the energy spectrum of photo-electrons generated by the out-of-band radiation).

Figure 4:
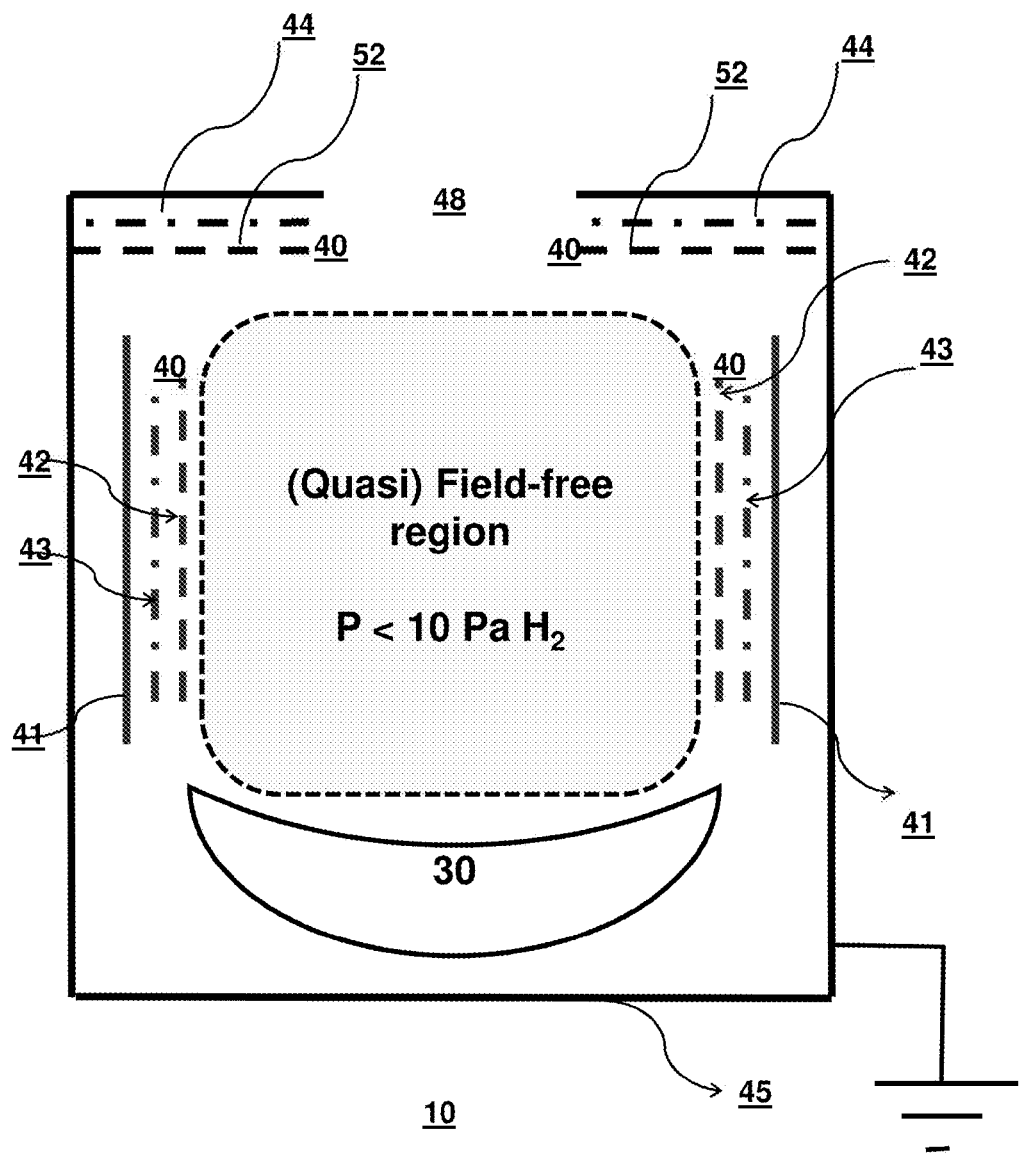

FIG. 4 shows a further enhancement of the principle illustrated in FIG. 3, of a radiation sensor device 10 for use with a radiation system. A target plate 30 in clear line of sight to aperture 48 comprises a surface impact region to be impacted by the radiation to generate photo-electrons. The surface impact region of target 30 is formed of an electrically conductive material of a dominant contamination. For EUV applications, this material is provided with a thickness larger than 50 nm, preferably from either carbon in compartments of the apparatus where the dominant contamination precursor exists of hydrocarbon molecules or Si(O x) in compartments where Si-based precursors are dominant. Preferably conductive surfaces in the sensor that are impacted by high energy photons are all formed of the same electrically conductive material of a dominant contamination. This may suppress (changes in) photo electron-emission by stray light photons from anode surfaces, in order to eliminate spurious electrons as much as possible.

Shield electrode structure 40 forms, by energising barrier electrodes 43 and 44, an electrostatic potential barrier that reflects photo-electrons with a lower kinetic energy (e.g. either created by lower energy photons, or EUV photo-electrons that have undergone inelastic scattering in the quasi field-free region) but absorbs high-energy photo-electrons in signal electrode 41.

The shield electrode structure 40 comprises a signal electrode 41 arranged inside housing 45 to trap high energy photo-electrons escaping from target 30.

Shield electrode structure 40 further comprises floating field clamp electrodes 42 and 52, formed by meshes or wire grids which may provide a region above the impact region that is quasi electric field free. The ionization potential for H2 is 15.6 eV. At 0.1 mbar H2, the typical mean free path for a <70 eV electron is 3 mm (Plasma science center PSC-25, Electron runaway in RF discharges, Francis F. Chen, ISSN-0915-7522, October 1992). Therefore, electrons can gain enough energy to ionize H2 molecules at a field strength of 15.6/0.003=5000 V/m. Thus, for field strengths substantially below that value, for example below 500 V/m for typical partial hydrogen pressures, this field clamp arrangement can limit distortion of the measurement signal due to electron signal gain by cascade effects of the type described by Danilatos (Advances in Electronics and Electron Physics, Volume 78, Issue C, 19909, pp 1-102) or possible Paschen breakdown effects, in particular, for higher partial pressures of hydrogen, for example in the region 5-10 mbar, or for lower pressures, below that region. Signal electrodes 41 can be further shielded from spurious low energy electrons by barrier electrodes 43 that have a laminar configuration relative to the signal electrodes 41, at close distance of for example less than 3 mm, of about –(minus) 70 V.

In addition, the shield electrode structure 40 comprises an aperture 48 with a potential barrier provided by negative barrier electrodes 44 and field clamping electrode 52 with a laminar configuration relative to the barrier electrode 44 and bounds a free-field volume inside the sensor device 10 on a side opposite the target 30. The barrier structure 40 optimally prevents spurious electrons from entering the sensor 10, or generated photo-electrons from escaping the sensor 10.

The cathode 30 can be shaped to optimally reflect the high energy radiation beam back into pupil exit 48, in order to reduce photo-electron emission inside the sensor by reflected radiation.

Figure 5:
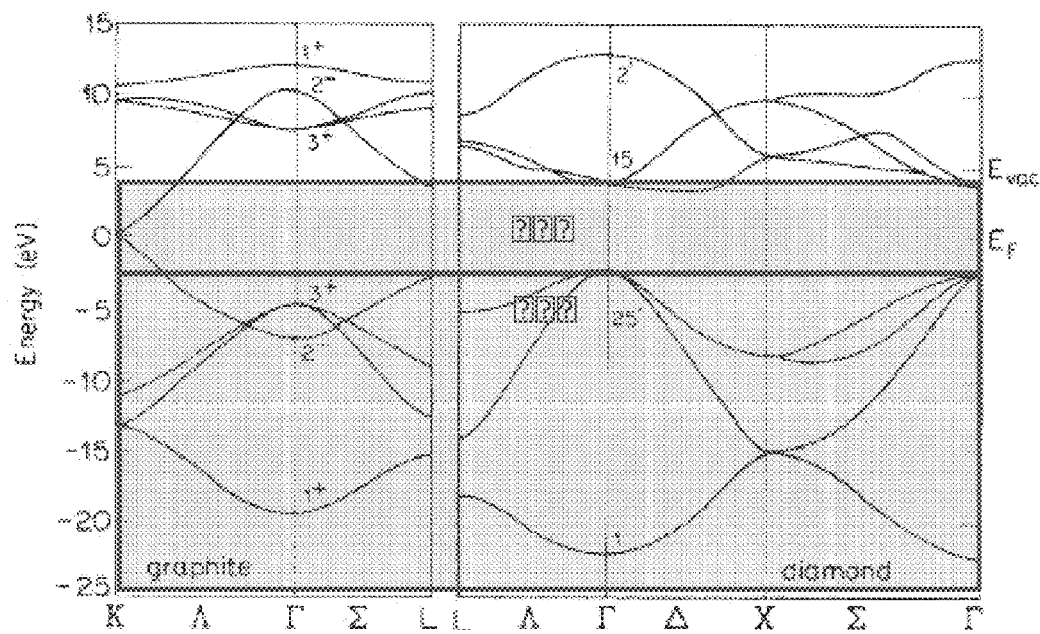
FIG. 5 depicts an illustrative chart for graphite and diamond energy states in connection with EUV and, as an example for out-of-band radiation, DUV photon energies.

Without being bound to the theory, for purposes of illustration, FIG. 5 shows energy levels of band structures for various lattice forms of carbon, in particular, the graphite and diamond forms which are sensitive for conversion of DUV and other out-of-band photons and EUV photons. The graph is derived from 'Electronic and Atomic structure of Amorphous Carbon, Robertson, Physical Review B. Condensed Matter, 1987, Vol 35, Nr 6, pp 2946. In the graph known Fermi energy levels are illustrated. Assuming a graphite target with a 20 nm mean free path of primary electrons and 1% absorption of EUV per nm carbon, it can be calculated that about 20% of the EUV photons can be converted into photo-electrons. For example, for EUV with a photon energy of 95 eV, for a work function (graphite) of about 5 eV and an additional 0 to 20 eV absorption loss due to the excitation of a core- or valence-level electron of the target, it can be expected that photo-electrons of 70-90 eV can be generated that can escape the target. It is noted that the target material being of electrically conductive carbon has favorable properties since the energy loss by photon absorption by core electrons is relatively limited, in contrast to target materials comprising heavier elements such as Si and/or Sn. In such materials the band structure has energy levels relative to the vacuum energy with high values.

This is less favorable since energy losses by photon absorption can be substantial, resulting in photo-electrons that cannot uniquely be discriminated anymore from lower energy photon impact generating similar photo electron energies. In contrast, in carbon suitable (high-energy) photo-electrons will be generated in response to EUV impact, that can be measured. In addition the sensor will have improved tolerance for layer thicknesses larger than the mean free path of the excited photo-electrons in carbon, i.e. larger than 20 nm, preferably larger than 50 nm or even larger, for example, larger than 1 micron. In practice a suitable thickness larger than 1 micron may offer an advantage that it may account for potential loss of target material (i.e. carbon) due to impact. In graphite, with a work function of 4.7 eV, for lower energy DUV photons (having 6.6 eV, and as an example for out-of-band radiation), primary electrons with energies higher than 3 eV will not be generated, resulting in suppression of the photo-electron signal for this spectral part. When the target is biased by several volts, the DUV-induced photo-current can be suppressed and, at a sufficiently large bias voltage, even reduced to zero. Similarly, also the photocurrent induced by higher-energy photons can be suppressed, without inhibiting the EUV-induced electrical signal. The sensor concept is compliant with a vacuum system having a relatively high partial pressure of up to several mbar molecular hydrogen. After leaving the target plate, photo-electrons can be detected from the target in an atmosphere with for example an hydrogen partial pressure environment with a pressure of about $1.0 \times 10^{-2}$ mbar to even higher values which may range from 0.5-5 mbar. With a target plate 3 with bias voltages below 100 V, there is no risk for Paschen breakthrough, e.g. a smallest distance for example larger than 0.1 mm for robust distancing from the shielding electrode 4.

Further Embodiments

In further embodiments, in view of the limited diameter of the aperture, e.g. smaller than 1 cm the sensor device can be placed at various EUV illuminated locations in the EUV lithography tool. For example, the sensor device can be provided in a EUV facet mirror, with an aperture that is integrated in a single facet.

In another embodiment, the sensor device can be placed near the EUV source, directly looking at the EUV radiation and debris.

In yet another embodiment the sensor device is placed near the mask, in order to monitor the amount of contamination accumulating on the mask.

Figure 6:
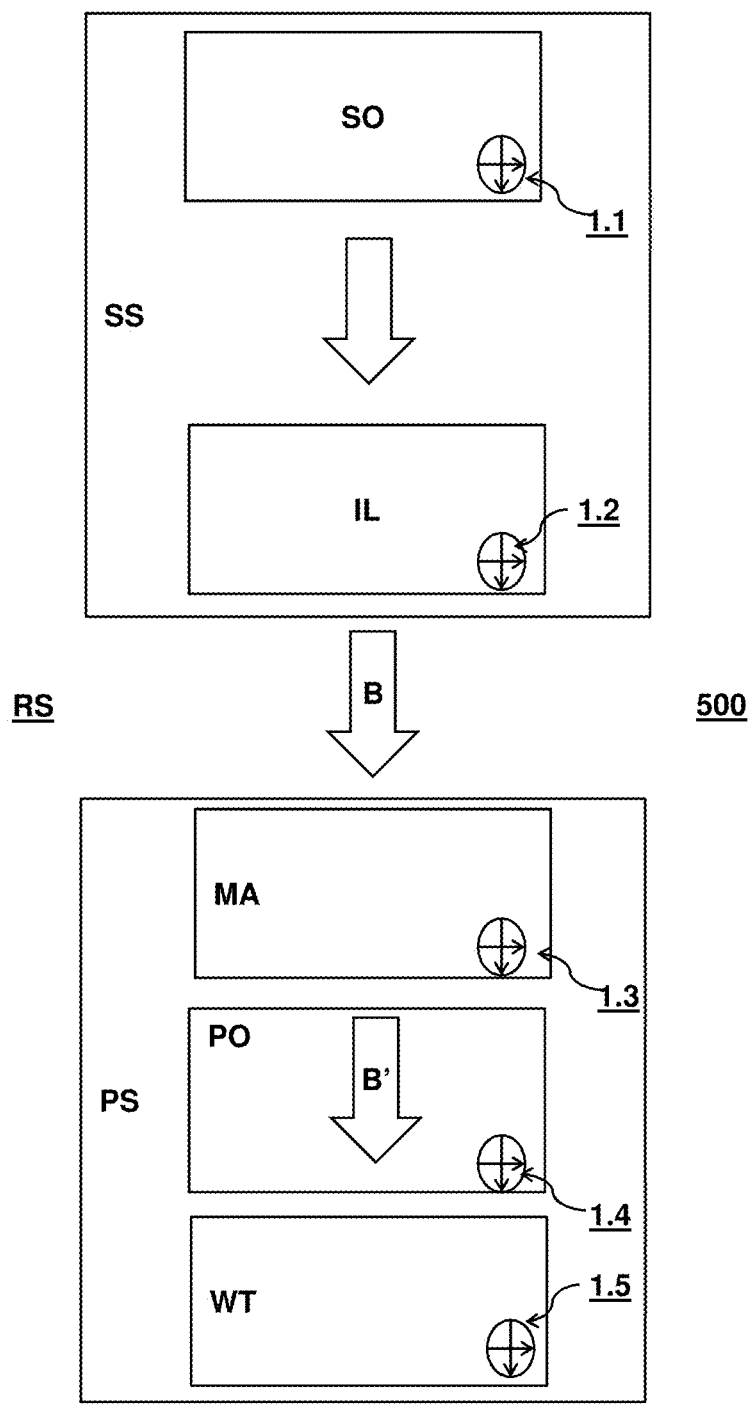
FIG. 6 shows a schematic setup of a lithographic system including a sensor device.

In the embodiment depicted in FIG. 6, schematically an EUV lithographic system is shown 500. As a practical example, an EUV detector 1.1 according to the embodiment depicted in FIG. 3 or FIG. 4, is placed, for example, at a distance of 10 cm from the EUV source SO. In a source system SS, EUV source SO typically generates an amount of debris equivalent to $10^{15}$-$10^{16}$ atoms per pulse. The apparatus further comprises an illumination system (illuminator) IL configured to condition a radiation beam B (e.g. EUV radiation) in known fashion. The illuminator may likewise be provided with a detector 1.2. In a patterning system PS, a support structure (e.g. a mask table) is constructed to support a patterning device (e.g. a mask) MA and configured to accurately position the patterning device in accordance with certain parameters. In yet another embodiment, a sensor device 1.3 is placed on the mask stage, to measure the EUV power. A substrate table (e.g. a wafer table) WT is constructed to hold a substrate (e.g. a resist-coated wafer) and configured to accurately position the substrate in accordance with certain parameters. Projection optics (e.g. comprising reflective projection optics) PO are configured to project a pattern imparted to the radiation beam B' by patterning device MA onto target portions a substrate. Substrate table WT may be provided with a sensor 1.5; projection optics PO may also be provided with a sensor 1.4. The radiation beam may be spatially filtered by a patterned sensor mask prior to irradiation the radiation sensor 1.5. Such a sensor mask can be used for coarse stage to mask alignment, or for optimizing the imaging qualities of the lithography tool optics. A sensor mask pattern may be formed by a grid similar to grid 4.2 as illustrated in FIG. 1, it can be electrically isolated or optionally provided with another bias voltage. Accordingly a patterned, partially EUV transmitting plate may be added to spatially filter the incoming EUV beam, to pattern the latter, enabling alignment of any of sensors 1.1-1.5 to the EUV beam and its beam delivery system (i.e. Source, illuminator, reticle and projection optics). Furthermore, the sensor signal may be used for optimizing the arrangement of the optical elements. Based on the information generated, decisions and/or actions in the scanner system can be initiated. E.g. re-calibration of the sensor itself, the transmission of (part of) the optical train, or specific cleaning/exchange actions etc. Plural target plates may be provided as segments with an electrical connection to each segment, capable of recording the spatial profile of the incident radiation.

The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device." In the figure illuminator IL receives a radiation beam from a radiation source SO. The source SO and the illuminator IL, together with a beam delivery system if required, may be referred to as a radiation system SS.

The detector may be integrated in any radiation system, which may be considered part of the EUV lithographic system. De detector may also be integrated in the patterning system PS, which may be considered part of the lithographic system.

Although in the previous embodiments the optical sensor device according to the invention has been described as an apparatus to be located in the vicinity of the source, the sensor device could also be used in further downstream optics, for instance for measuring a contamination level of the system, in particular, for instance for measuring carbon levels or the like. In such embodiments, the sensor device surface may be also not placed in a clear line of sight via the aperture entry to the radiation source but may be indirectly exposed, via EUV-reflecting mirrors.

Furthermore, although the sensor device has been disclosed with a target material provided a material of a purity larger than 90 weight percent of carbon, depending on the dominant contaminant, also other material such as for instance Sn could be used, if that element is dominating contamination.

The disclosed sensors may have a variety of advantages. Firstly the novel sensor device can be orders of magnitude less sensitive for the dominant contaminant in EUV systems, being carbon. Secondly the materials used for constructing the sensor device is completely compliant with the EUV allowed materials list. Thirdly, a sensor signal can be read out with a large bandwidth, allowing for the analysis of the EUV pulse structure. At last, the sensor device hardware layout is simple and may have a very competitive market price.

While example embodiments were shown for systems and methods, also alternative ways may be envisaged by those skilled in the art having the benefit of the present disclosure for achieving a similar function and result. E.g. some components may be combined or split up into one or more alternative components. The shield electrode may be formed by a singular conductive structure or by a complex laminated structure that is formed by galvanically separated constituents in order to provide a desired electric field configuration. The shield electrode structure is arranged to detect photo-electrons but shield spurious and low-energy electrons. In other words, the shield electrode structure is capable of filtering the photo-electrons that reach the signal electrode based on their kinetic energy by means of an electrostatic potential barrier on a barrier electrode, which is part of the shielding electrode structure. Furthermore, a signal electrode may be part of the electrode structure for measuring a photo-electron deficit current as a result of radiation impact on the surface impact region—the signal electrode is arranged in laminar fashion relative to the shielding electrode. The barrier electrode is electrically separated from the shield electrode and signal electrode, where the barrier electrode is set to a barrier voltage to prevent out-of-band photo-electrons to reach the signal electrode.

The invention can be further characterized by a radiation sensor device for use with a radiation system, capable of delivering radiation with high energy photons and comprising a target comprising a surface impact region to be impacted by the radiation to generate photo-electrons, the target being electrically conductive and isolated from a shielding electrode structure; a shielding electrode structure arranged to collecting photo-electrons from the target surface impact region being formed of an electrically conductive material of a dominant contamination provided with a thickness larger than 50 nm, wherein an insulator is provided distancing the target from the shielding electrode structure, and fixing the target relative to the shielding electrode structure; and a current measurement device that is operative to keep the target at a preset voltage difference with respect to the shielding electrode and measure a photo-electron deficit current from a signal electrode that is part of the shielding electrode structure, as a result of radiation impact on the surface impact region. For example, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the scope of the present systems and methods as set forth in the claims that follow. The specification and drawings are accordingly to be regarded in an illustrative manner and are not intended to limit the scope of the appended claims.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage.

The invention claimed is:

1. A radiation sensor device for use with a radiation system, capable of delivering radiation with high energy photons, comprising:
   a target comprising a surface impact region to be impacted by the radiation to generate photo-electrons, the target being electrically conductive and isolated from a shielding electrode;
   the shielding electrode is arranged to collecting photo-electrons from the target;
   the surface impact region being formed of an electrically conductive material of a dominant contamination provided with a thickness larger than 50 nm, wherein an insulator is provided distancing the target from the shielding electrode, and fixing the target relative to the shielding electrode; and
   a current measurement device that is operative to keep the target at a preset voltage difference with respect to the shielding electrode and measure a photo-electron deficit current as a result of radiation impact on the surface impact region.

2. The radiation sensor device according to claim 1, wherein the shielding electrode is at least partly provided as a housing for the target plate.

3. The sensor device according to claim 1, wherein the shielding electrode comprises an aperture entry extending from the target plate by a length larger than three times an aperture diameter.

4. The sensor device according to claim 1, wherein the surface impact region is provided from a dominant contamination material of a purity larger than 90 weight percent.

5. The sensor device according to claim 1, wherein the target plate is homogenously provided from carbon material that is a graphite, graphene or amorphous carbon.

6. The sensor device according to claim 1, wherein the current measurement device is arranged to measure the photo-electron deficit current as a function of a preset bias voltage.

7. The sensor device according to claim 1, wherein the target plate is provided in a clear line of sight via the aperture entry to the radiation source.

8. The sensor device according to claim 1, further comprising a sensor pattering mask.

9. The sensor device according to claim 1, further comprising a signal electrode for measuring a photo-electron deficit current as a result of radiation impact on the surface impact region—the signal electrode arranged in laminar fashion relative to the shielding electrode and the barrier electrode and electrically isolated therefrom, where a barrier voltage is set to prevent out-of-band photo-electrons to reach the signal electrode.

10. The sensor device according to claim 1, constructed with an aperture diameter smaller than 1 cm.

11. The sensor device according to claim 1, wherein the sensor device is integrated in a EUV facet mirror, with an aperture that is integrated in a single facet.

12. The sensor device according to claim 1, wherein said source is a laser induced plasma EUV source, a discharge produced plasma EUV source, an EUV emitting free-electron laser or a synchrotron EUV source.

13. The sensor device according to claim 1, wherein the shielding electrode comprises a mesh covering the target plate.

14. The sensor device according to claim 1 comprising a target comprising a plurality of segmented surface impact regions with an electrical connection to each segment capable of recording a spatial profile of incident radiation.

15. A lithographic apparatus, including the sensor device according to claim 1.

16. A method for measuring radiation within a radiation system, capable of emitting high energy photons, comprising:
- a target comprising a surface impact region being formed of an electrically conductive material of a dominant contamination in the radiation system, provided with a thickness larger than 50 nm; the target to be impacted by the radiation to generate photo-electrons;
- shielding the target by a shielding electrode structure arranged to collecting photo-electrons from the target;
- keeping the target at a preset voltage difference with respect to the shielding electrode; and
- measuring a photo-electron deficit current from the shielding electrode structure as a result of radiation impact on the surface impact region.

* * * * *